TUNNEL DIODE WITH TUNNELING CHARACTERISTIC AT REVERSE BIAS

Filed June 28, 1963

INVENTOR
JOHN GOW, 3RD.

United States Patent Office 3,278,812

Patented Oct. 11, 1966

3,278,812

TUNNEL DIODE WITH TUNNELING CHARACTERISTIC AT REVERSE BIAS

John Gow 3rd, Marlboro, N.Y., assignor to International Business Machines Corporation, New York, N.Y., a corporation of New York Filed June 28, 1963, Ser. No. 291,473
5 Claims. (Cl. 317—234)

This invention relates to semiconductor quantum mechanical tunneling devices, specifically tunnel diodes.

Conventional tunnel diodes of the prior art have a current-potential characteristic including, in the forward bias region thereof, a negative resistance portion between two positive resistance portions.

In designing circuits using tunnel diodes, it has sometimes been desired to have a tunnel diode device having a quantum mechanical tunneling characteristic (more particularly a negative resistance portion between two positive resistance portions) in the reverse bias region of its current-potential characteristic. Such a device would make possible the construction of circuits complementary to circuits using conventional tunnel diodes. No such device has heretofore been known.

An object of the invention is to provide a quantum mechanical tunneling device having, in the reverse bias region of its current-potential characteristic, a negative resistance portion between two positive resistance portions.

Another object is to provide a method of making such a tunneling device.

The foregoing and other objects of the invention are attained in the process and product described herein. In accordance with that process, a wafer of non-degenerate N-type germanium is first subjected to an alloying operation with an alloy dot including donor impurities, thereby producing in the germanium a recrystallized region having a concentration of donor atoms sufficient to make that region degenerate. The wafer is then cooled and thereafter subjected to a second alloying operation in which there is alloyed into the recrystallized region from the first alloying step a second alloy including acceptor impurities in sufficient concentration so that there is produced a second recrystallized region which is degenerate and has P-type conductivity. The wafer with the two alloyed regions is then cooled. A diode so constructed will have the desired tunneling characteristic in the reverse bias region of its current-potential characteristic, if the wafer is considered as the cathode of the diode.

Other objects and advantages of the invention will become apparent from a consideration of the following specification and claims, taken together with the accompanying drawing.

Figure 1:
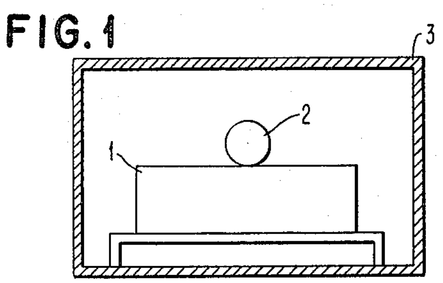
FIG. 1 is a diagrammatic illustration of a first alloying step in a method according to the invention.

The starting material for the process embodying the present invention may be a wafer of N-type semiconductive material, e.g., germanium, having a resistivity of 0.06 ohm-centimeter. The resistivity is not critical, although it should be as low as convenient without being degenerate material. On the surface of that wafer there is placed a dot containing donor impurity atoms. The dot may be a sphere about 0.025" in diameter and consist essentially of 98% lead and 2% antimony. The dot is alloyed into the wafer by subjecting the wafer with the dot resting on it to a temperature of about 750° C. for about two hours. This step is illustrated in FIG. 1, where the wafer is shown at 1, the dot at 2, and a furnace is illustrated diagrammatically at 3. The alloyed dot structure is then cooled slowly, without quenching. The atmosphere in the furnace during the alloying process may be 10% hydrogen and 90% nitrogen. Such an atmosphere is reducing to the extent that any oxygen present is removed by combination with the hydrogen. The rate of cooling should be not substantially greater than 10° C. per minute.

In an alloying process of this type, the molten dot dissolves a portion of the wafer and the two melt and fuse together. Thereafter, upon slow cooling, the molten material recrystallizes, regrowing at least a portion of the single crystal structure of the wafer, but with impurities added from the dot.

Figure 2:
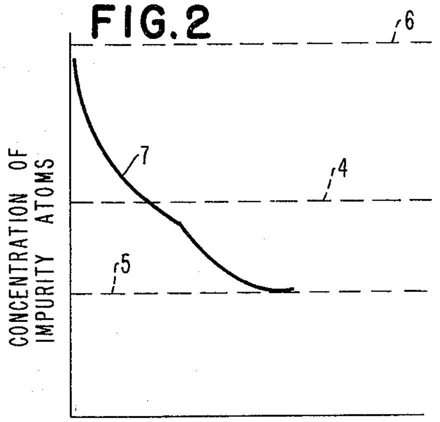
FIG. 2 is a graphical illustration of the variation in the concentration of impurity atoms in the semiconductor product of the alloying step of FIG. 1.

In FIG. 2, there is illustrated a curve conventionally known as a doping profile of the alloyed wafer and dot structure resulting from the alloying step of FIG. 1. The ordinates in FIG. 2 are expressed in terms of concentration of impurity atoms per cubic centimeter. The dotted line 4 represents a concentration above which the material is commonly spoken of as being degenerate. The concentration represented by the ordinate 5 represents the concentration in the N-type wafer before the alloying step. This concentration is not particularly critical, and may, for example, be $10^{17}$ atoms per cubic centimeter. It should be understood that the nearer this concentration approaches the limit of solid solubility, indicated at 6, the less impurity atoms have to be added during the alloying step. The profile 7 shows that after the alloying step, the concentration of impurity atoms at the surface of the germanium wafer, represented by the zero abscissa, rises near the limit of solid solubility. With the increasing depth below the wafer surface, represented by the abscissae in the diagram, the concentration decreases down to the pre-existing level indicated at 5.

Figure 3:
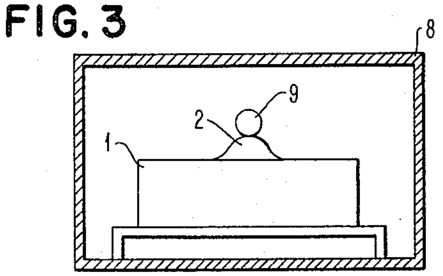
FIG. 3 is a diagrammatic illustration of a second alloying step to which the product of FIG. 1 step is subjected.

The alloyed wafer and dot resulting from the operation in FIG. 1 are then placed in a furnace illustrated diagrammatically at 8 in FIG. 3 with a second dot 9, of a composition to provide acceptor impurities, placed on the top of the dot 2. The dot 9 may consist essentially of about 99.8% lead, and about 0.2% gallium, the gallium providing the acceptor impurities. The dot 9 should be about one-seventh of the volume of dot 2. This combination of the wafer 1 and dots 2 and 9 is then heated at about 650° C. for about one hour and is then cooled slowly, without quenching.

The alloyed wafer and dot structure resulting from the process of FIG. 3 is etched in a conventional manner to clear away any surface bridging of the barrier junctions formed during the alloying process.

Figure 4:
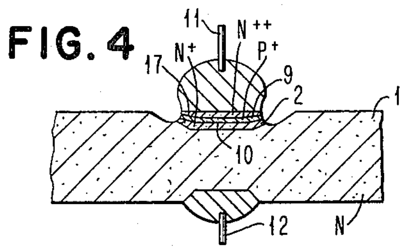
FIG. 4 is a central cross-sectional view through the product of the process of FIG. 3.

The product of FIG. 3 process is illustrated in cross-section in FIG. 4. It might be expected that this product would include a single PN junction 10, and that that junction might have quantum mechanical tunneling characteristics, since the material on both sides of the junction is degenerate. Consequently, it would be expected that a current-potential characteristic taken with an anode 11 ohmically soldered to the top of the dot 9 and a cathode 12 ohmically soldered to the bottom of the wafer 1 would be a conventional tunnel diode characteristic. It is found, however, by actual test, that the current-potential characteristic so taken has a negative resistance portion appearing in the reverse bias region of the characteristic and has no negative resistance portion in the forward bias region of the characteristic. The current-potential characteristic actually obtained is illustrated in FIG. 5 at 13 with the negative resistance portion at **13*a***

Figure 5:
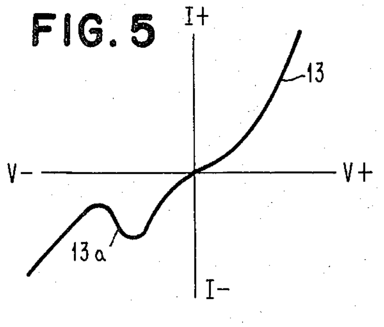
FIG. 5 is a graphical illustration of the current-potential characteristic of that product.

The following is a theoretical explanation of the structure of FIG. 4 and of the reasons why the characteristic of FIG. 5 is obtained from that structure. While it is presently believed that this theory is correct, it has not been confirmed in all its details, and the applicant's invention is not to be limited by this specific theory.

Figure 6:
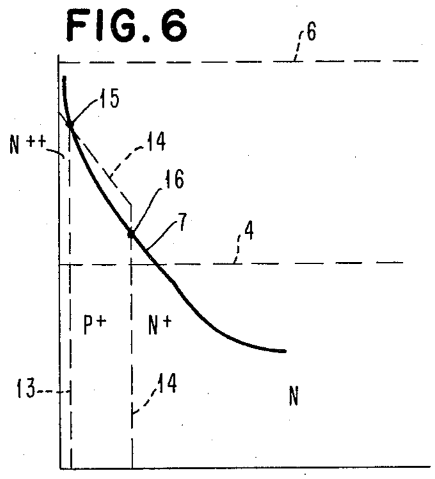
FIG. 6 is a graphical illustration of the variation in concentration of impurity atoms in the product of FIG. 4.

FIG. 6 shows graphically the profile 7 of FIG. 2, upon which is superimposed a doping profile 14 representing the variation with depth of the concentration of acceptor impurities introduced by the second alloying operation of FIG. 3. Note that the profile 14 crosses the profile 7 twice, at the points 15 and 16. These points establish depths at which two PN junctions occur, as shown at 10 and 17 in FIG. 5. The material in the region between the two junctions 10 and 17 is P-type material and approaches the limit of solid solubility, as indicated by the P+ legend in the drawing. The material deeper than the junction 10 is N-type material and approaches the limit of solid solubility adjacent the junction 10 as indicated by the legend N+ in the drawing. The material above the junction 17 is N-type material and, in particular is N++ as shown.

Figure 8:
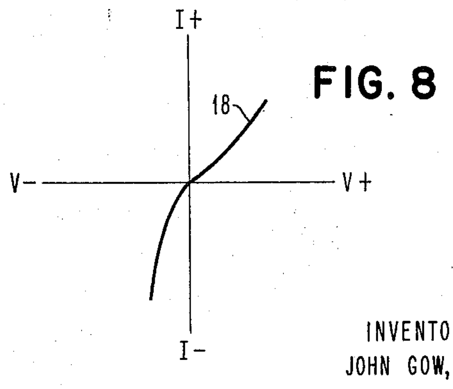
FIGS. 7 and 8 are graphical illustrations representing theoretical current-potential characteristics of certain portions of the product.
Figure 7:
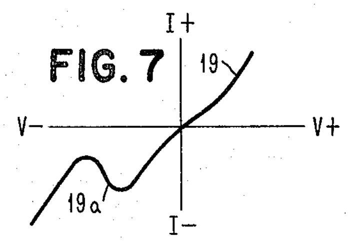

Conventionally, it would be expected that only one PN junction would be formed, namely the junction 10 at the intersection 16 in FIG. 6, and that it would have conventional tunnel diode characteristics. It is believed, however, that two PN junctions are formed, the one at intersection 16 having characteristics such as that shown in FIG. 8 at 18, where no negative resistance region appears. There is also formed a second PN junction at the intersection 15, due to the difference between the segregation coefficients of the two impurities (antimony, gallium) used in the two alloying steps. That is to say, the gallium is more heavily concentrated in that part of the molten crystal which freezes first on cooling, while the antimony predominates in the last part to freeze. This second junction 17 has its polarity reversed with respect to the junction 10. It is considered that the junction 17 has a completely developed typical tunnel diode characteristic, such as illustrated at 19 in FIG. 7, with a negative resistance portion at **19*a* in its reverse bias region. The curve 13 of FIG. 5 may then be considered as the sum of the two curves 18 of FIG. 8, and 19** of FIG. 7, with appropriate scale corrections.

It is considered that the invention is applicable to other semiconductor materials, provided that the two impurity materials used have substantially different segregation coefficients.

While I have shown and described a preferred embodiment of my invention, other modifications thereof will readily occur to those skilled in the art and I therefore intend my invention to be limited only by the appended claims.

I claim:

1. A semiconductor junction diode having only two terminals comprising:

(a) a wafer of N-type semiconductive material;

(b) a first region alloyed into said wafer including an excess of donor atoms sufficient to make said region degenerate; and (c) a second region alloyed into said first region and including an excess of impurity atoms sufficient to make at least a portion of said second region degenerate with P-type conductivity and another portion of said second region heavily doped to degeneracy with N-type conductivity;

(d) said diode exhibiting quantum tunneling characteristics with a negative resistance portion in its V.I. characteristic under reverse bias only, when said second region is connected to the negative terminal of a direct current source and the wafer outside the first region is connected to the positive terminal of said source.

2. A semiconductor diode as defined in claim 1, in which said donor atoms and said acceptor atoms have substantially different segregation coefficients.

3. A semiconductor diode as defined in claim 2, in which said wafer is germanium, and said N-type impurity is antimony.

4. A semiconductor diode as defined in claim 3 in which said P-type impurity is gallium.

5. A semiconductor junction device, having only two terminals and including a body of semiconductor material having at least three regions comprising:

(a) a first degenerate region having extrinsic conductivity of one type; and (b) second and third degenerate regions having extrinsic conductivity of the opposite type and adjoining said first degenerate region at separate barrier junctions, said second and first degenerate regions defining a tunnel diode junction, said device having a negative resistance portion in its V.I. characteristic under reverse bias only.

References Cited by the Examiner

UNITED STATES PATENTS

| | | | |
|---|---|---|---|
| Re. 25,087 | 11/1961 | Abraham | 317—234 |
| 2,877,147 | 3/1959 | Thurmond | 148—1.5 |
| 2,985,550 | 5/1961 | Anderson | 148—15 |
| 3,015,048 | 12/1961 | Noyce | 317—234 |
| 3,114,864 | 12/1963 | Chih-Tang Sah | 317—234 |
| 3,133,336 | 5/1964 | Marinace | 29—25.3 |
| 3,198,087 | 7/1965 | Nissim | 148—1.5 |

OTHER REFERENCES

IBM Technical Disclosure Bulletin, vol. 5, No. 4, September 1962, "Composite Semiconducting Elements," by Y. Poupon.

JOHN W. HUCKERT, *Primary Examiner.*

M. EDLOW, *Assistant Examiner.*